United States Patent [19]
Chen et al.

[11] Patent Number: 5,656,546
[45] Date of Patent: Aug. 12, 1997

[54] SELF-ALIGNED TIN FORMATION BY $N_2^+$ IMPLANTATION DURING TWO-STEP ANNEALING TI-SALICIDATION

[75] Inventors: Chii-Wen Chen; Mong-Song Liang, both of Hsin-Chu, Taiwan

[73] Assignee: Taiwan Semiconductor Manufacturing Company Ltd, Hsin-Chu, Taiwan

[21] Appl. No.: 520,117

[22] Filed: Aug. 28, 1995

[51] Int. Cl.$^6$ .................................................. H01L 21/28
[52] U.S. Cl. ...................... 438/586; 438/655; 438/659; 438/664; 438/902
[58] Field of Search ............................ 437/24, 190, 192, 437/200, 982

[56] References Cited

U.S. PATENT DOCUMENTS

| | | | |
|---|---|---|---|
| 5,004,704 | 4/1991 | Maeda et al. | 437/195 |
| 5,397,744 | 3/1995 | Sumi et al. | 437/200 |
| 5,508,212 | 4/1996 | Wang et al. | 437/200 |
| 5,512,502 | 4/1996 | Ootsuka et al. | 437/200 |

FOREIGN PATENT DOCUMENTS

| | | |
|---|---|---|
| 63-181422 | 7/1988 | Japan . |
| 63-204743 | 8/1988 | Japan . |
| 2185624 | 7/1987 | United Kingdom . |

OTHER PUBLICATIONS

S.P. Muraka, "Refractory Silicides for Integrated Circuits" J. Vac. Sci. Tech. vol. 17, p. 775 (1980).

C.K. Lau et al. "Titanium Disilicide Self–aligned Sarce/ drain & gate Technology" IEDM Tech Dig (1982) p. 714.

T. Okamoto et al, "Titanium Silicidation by Halogen Lamp Annealing" J. Appl.Physics, vol. 57, p.5251 (1985).

Alperin et al, "Development of the Self–aligned Titanium Silicide Process for VLSI Applications," IEEE J. Solid–State Circuits, vol. 20, No. 1 pp. 61 (1985).

Wittimer, "TiN and TaN diffusion barriers in metallizations to silicon semiconductor devices " Appl. Phys. Letters, vol. 36, p. 456 (1980).

Ting et al, "Investigation of the Al/TiSi$_2$/Si Contact System" J. Appl. Physics vol. 54 p.937 (1983).

Sun et al, "Al/W/TiN$_x$/TiSi$_y$/Si Barrier Technology for 1.0–μm Contacts" IEEE Electron Device Letters, vol. 9, p. 71 (1988).

Kaneko et all, "Novel Submicrometer MOS Devices by Self–aligned Nitridation of Silicide", IEEE Trans Electron Der. vol. 33, No. 11 p. 1702 (1986).

Ku et al, "Stable, Self–aligned TiN$_x$O$_y$TiSi$_2$ contact formation for submicron device applications", Appl. Phys. Letters, vol. 50, No. 22, p. 1598 (1987).

Willemsen et al, "In situ Investigation of TiN Formation on Top of TiSi$_2$" J. vac Sci Tech, vol. B6, No. 1, p. 53 (1988).

Kamgar et al, "Self–aligned TiN Barrier Formation by Rapid Thermal Nitridation of TiSi$_2$ in Ammonia", J. Appl Phys, vol .66, No.6, p. 2395 (1989).

Nishiyama et al, "A Thermally Stable Salicide Processing $N_2$ Implantation into TiSi$_2$," IEEE VMIC Conference, p. 310 (1990).

Primary Examiner—John Niebling
Assistant Examiner—Thomas G. Bilodeau
Attorney, Agent, or Firm—George O. Saile; Grahm S. Jones, II

[57] ABSTRACT

A self-aligned TiN/TiSi$_2$ formation using $N_2^+$ implantation during a two-step annealing Ti-salicidation process is provided. The leakage currents of n$^+$/p junction diodes fabricated using this technology were measured to investigate the phenomena of Al spiking into Si-substrate. The measured reverse-bias leakage current of diode per unit junction area with Al/TiN/TiSi$_2$ contact is 1.2 nA/cm$^2$ at –5 Volts, which is less than all of reported data. Also it can sustain the annealing process for 30 min at 500° C. Thus, TiN formed with this technology process provides an effective barrier layer between TiSi$_2$ and Al for submicron CMOS technology applications.

5 Claims, 4 Drawing Sheets

SELF-ALIGNED TIN FORMATION BY $N_2^+$ IMPLANTATION DURING TWO-STEP ANNEALING TI-SALICIDATION

BACKGROUND OF THE INVENTION

1. Field of the invention

This invention relates to integrated circuit MOS FET devices and more particularly to diffusion barriers for forming improved metallization interfaces on the surface of silicon containing materials including gate electrodes and source/drain regions in a MOSFET device.

2. Description of Related Art

As CMOS technology is scaled down to the deep-submicrometer scale for ULSI, use is made of a Ti-salicide layer formed by a two-step annealing process which has been shown as an excellent metal silicide to reduce sheet resistance in source/drain regions. See S. P. Muraka, "Refractory silicides for integrated circuits," J. Vac. Sci Tech., vol. 17, pp. 775, (1980); C. K. Lau, Y. C. See, D. P. Scott, J. M. Bridges, S. A Perna, and R. D. Davies, "Titanium disilicide self-aligned source/drain+gate technology," in IEDM Tech. Dig. (1982) p. 714; T. Okamoto, K. Tsukamoto, M. Shimizu, and T. Matsukawa, "Titanium silicidation by halogen lamp annealing," J. Appl. Phys., vol. 57, p. 5251, (1985); and Michael E. Alperin, Thomas C. Hollaway, Roger A. Haken, Clayton D. Gosmeyer, Robert V. Kamaugh, and Walter D. Parmantle, "Development of the self-aligned Titanium silicide process for VLSI applications," IEEE J. Solid-State Circuits. vol. 20, no. 1, p. 61, (1985.)

Also TiN is an effective diffusion barrier metal to prevent $TiSi_2$ morphology from agglomerating, and to retard junction spiking i.e., the aluminum (Al) in the contact hole interdiffuses into the Si-substrate during post thermal cycles. See M. Wittmer, "TiN and TaN as diffusion barriers in metallizations to silicon semiconductor devices," Appl. Phys. Lett., vol. 36, p. 456, (1980); C. Y. Ting and M. Wittmer, "Investigation of the Al/TiSi-2/Si contact system," J. Appl. Phys., vol. 54, p. 937, (1983); and S. W. Sun, J. J. Lee, B. Boeck, and R. L. Hance, "Al/W/TiN$_x$/TiSiy/Si barrier technology for 1.0 µm contacts," IEEE Electron Device Lett. vol. 9, p. 71, (1988).

In the past, many technologies to form self-aligned TiN/$TiSi_2$ structures have been reported. See Hiroko Kaneko, Mitsumasa Koyanagi, Shinji Shimizu, Yukiko Kubota, and Seigo Kishino, "Novel submicrometer MOS devices by self-aligned nitridation of silicide," IEEE Trans. Electron Devices, vol. 33. no. 11. p. 1702 (1986); Y. H. Ku, E. Luis, D. K. Shih, S. K. Lee. D. L. Kwong, and N. 8. Alvi, "Stable, self-aligned $TN_xO_y$/$TiSi_2$ contact formation for submicron device applications," Appl. Phys. Lett., vol. 50, no. 22. p. 1598, (1987); M. F. C. Willemsen, A. E. T. Kuiper, A. H. Reader. R. Hokke. and J. C. Barbour, "In situ investigation of TiN formation on top of $TiSi_2$,- J. Vac. Sci. Tech., vol. B6, no. 1, p. 53, (1988); Avid Kamgar, F. A. Baiocchi. A- B. Emerson, T. T. Sheng, M. 1. Vasile, and Richard W. Haynes. "Self-aligned TiN barrier formation by rapid thermal nitridation of $TiSi_2$ in ammonia." J. Appl. Phys., vol. 66. no. 6., p. 2395 (1989). However, the only one film formed by naked $TiSi_2$ nitrided at high temperature in these technologies showed poor uniformity.

Recently, a thermally stable, uniform TiN formation process using $N^+$ implantation was reported by A. Nishiyama, Y. Akasaka, Y. Ushiku. K. Hishioka, Y. Suizu, and M. Shiozaki, "A thermally stable salicide process using $N_2$ implantation into $TiSi_2$," in IEEE VMIC Conference, p. 310, (1990). But the leakage current of an $n^+$/p junction diode employed in this process was one order larger than that of diode without $N^+$ implantation.

U.S. Pat. No. 5,397,744 of Sumi shows the use of $N_2$ ion implanted into TiN to form an alpha Ti in a different type of a process.

SUMMARY OF THE INVENTION

With this invention, as contrasted to Nishiyama et al a novel self-aligned TiN formation process leads to reduced leakage current is provided. In addition, the application of this technology on 0.8 µm MOSFET devices is illustrated. The addition of $N_2^+$ implant before Ti-salicide formation further reduces junction leakage and improve transistor current drive.

A method for fabricating a semiconductor device having a silicon containing material to which a metal contact is to be made comprises forming a blanket layer of titanium on the device; performing a first rapid thermal annealing process on the device in a nitrogen gas atmosphere to convert the titanium layer into reaction products of titanium with the substrate and with the nitrogen, etching the device to remove titanium and titanium nitride from the device, ion implanting nitrogen ions into the device, and performing a second heating the device rapid thermal annealing process on the device.

Preferably, the first rapid thermal anneal is performed at about 680° C. for about forty seconds and the second rapid thermal anneal is performed at about 920° C. for about forty minutes.

Preferably, the device is annealed in the first anneal for about forty seconds producing combinations and compounds of titanium, nitrogen and oxygen, generally defined by $TiN_xO_y$ where x and y are integers, over portions of the device an titanium silicide over silicon containing portions of the device.

Preferably, nitrogen ions comprise $^{28}N_2^+$ molecular ions implanted with a dose of about $1\times10^{16}$ ions/cm$^2$ at an energy between about 20 KeV and about 50 KeV.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Overview of Manufacturing Process

To form a TiN/TiSi$_2$ bilayer, initially a 80 nm thick titanium film wes sputtered onto a silicon (Si) wafer. Then a first Rapid Thermal Anneal (RTA) is performed at 680° C. for 40 seconds in a nitrogen gas (N$_2$) ambient atmosphere. The TiN$_x$O$_y$ and/or unreacted Ti on the top were selectively etched.

After that $^{28}N_2^+$ molecular ions with 1×10$^{16}$ ions/cm$^2$ dose under different 20–50 KeV energies were implanted into so-called C$_{49}$TiSi$_x$ [Okamoto et al supra], respectively.

Finally, a BPSG dielectric cap was deposited and flowed at 920° C. for 40 min. This flow process is also regarded as the second annealing of Ti-salicidation.

Diodes formed with 80 KeV, 5.5×10$^{15}$ ions/cm$^2$ As-dosed junction and 0.8-μm CMOSFET's with Al/TiN/TiSi$_2$ contacts were prepared using this technology. For comparison purpose, diodes with N$^+$ implanted into so-called C54TiSi$_2$ was also fabricated [Nishiyama et al supra]. The N$_2^+$ was implanted after the second annealing to convert C49TiSi$_x$ to C54TiSi$_2$ had been done at 850° C. for 20 seconds in a nitrogen gas (N$_2$) ambient, then followed by BPSG (borophosphosilicate glass) deposition and thermal flow to smooth the surface of the BPSG layer.

Results of Manufacturing Process

Figure 1:
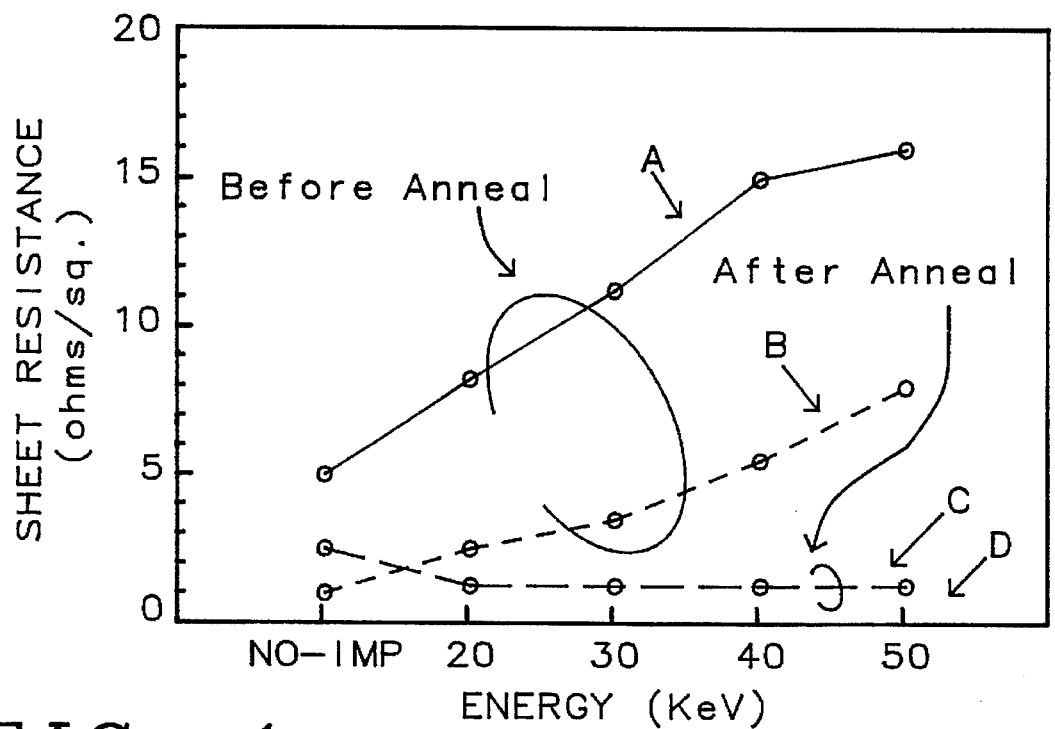
FIG. 1 shows curves of sheet resistance of TiN/$TiSi_2$ bilayer before and after annealing as a function of $N_2^+$ energy implanted into C49 or C54 Ti-salicide with a dose of $1\times10^{16}$ ions/cm$^2$.

FIG. 1 shows curves of sheet resistance of TiN/TiSi$_2$ bilayer before and after annealing as a function of N$_2^+$ energy implanted into C49 or C54 Ti-salicide with a dose of 1×10$^{16}$ Ions/cm$^2$. The anneal was done at 920° C. for 40 minutes after BPSG deposition.

(a) samples with N$_2^+$ implanted into C49 TiSi$_x$ before anneal, (b) samples with N$_2^+$ implanted into C54 TiSi$_2$ before anneal, (c) samples with N$_2^+$ implanted into C49 TiSi$_x$ after anneal, and (d) samples with N$_2^+$ implanted into C54 TiSi$_2$ after anneal. ("NO-IMP." denotes the samples without N$_2^+$ implantation.)

FIG. 1 shows the sheet resistances of TiN/TiSi$_2$ bilayers as a function of implanted N+ energy, which were obtained from an average of 49 values by the four-point method. The sheet resistance of C49TiSi$_x$ and C54TiSi$_2$ before N$_2^+$ implantation are 5.14 and 1.23 ohms/sq., respectively. The sheet resistance then increases significantly with the energy of N$_2^+$ implantation. The samples without N$_2^+$ implantation have a trend to agglomerate observed from the increase of sheet resistance after annealing [see Nishiyama et al]. Whereas the samples with N$_2^+$ implantation almost keep a constant value in the range of 20–50 KeV after annealing (Lines C&D), even the Rs values of C49 samples (Line C) are larger than that of C54 samples (Line D), but the difference is very small (0.15 ohms/sq.) and can be neglected as compared to the estimate of error 0.1 ohms/sq. in the measurements.

Figure 2:
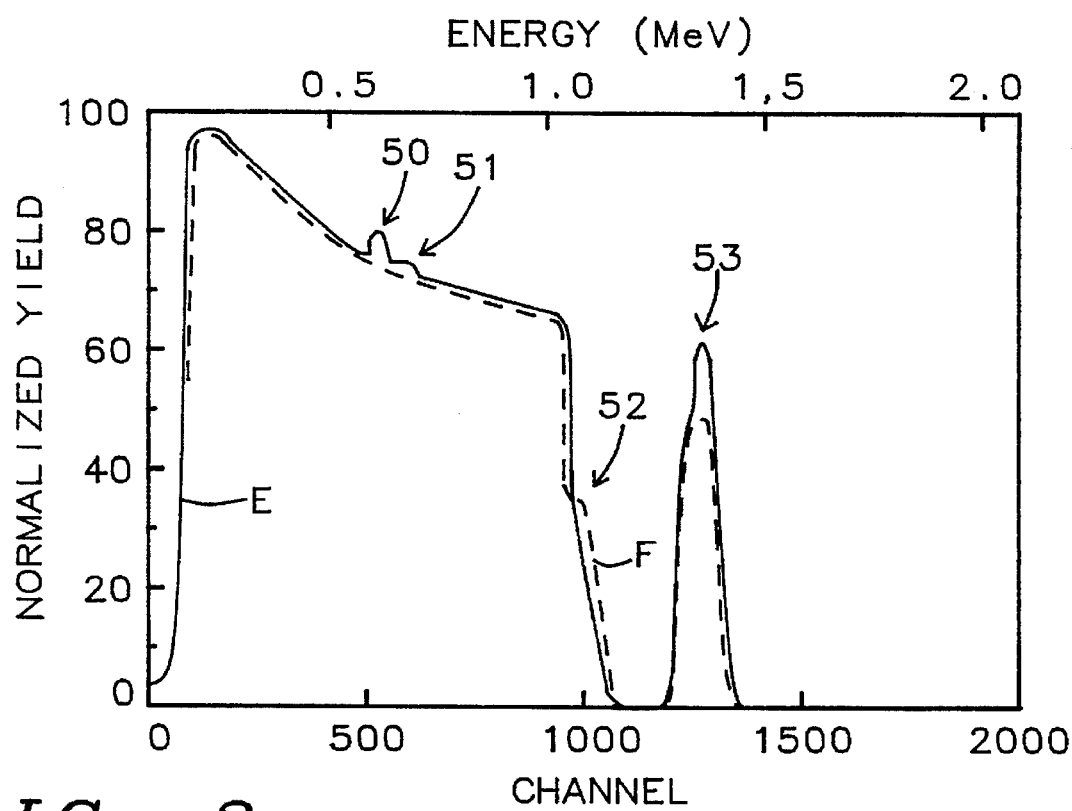
FIG. 2 shows RBS spectra of TiN/$TiSi_2$/Si and $TiSi_2$/Si structures formed with,and without $N_2^+$ implanted into C49 $TiSi_x$ and followed by 920° C., 40 min annealing.

The formation of TiN was confirmed by RBS analysis. The RBS spectra of samples with and without 30 KeV N$_2^+$ implanted into C49TiSi$_x$ during Ti-salicidation are compared in FIG. 2 and denoted as solid line and dash line, respectively. In particular, FIG. 2 shows RBS spectra of TiN/TiSi$_2$/Si and TiSi$_2$/Si structures formed with and without N$_2^+$ implanted into C49 TiSi$_x$ and followed by 920° C., 40 min. annealing. An obvious N peak 50 as well as a higher Ti peak 53 are observed in the sample E with N$_2^+$ implantation. This evidences the formation of a titanium nitride TiN layer. The small oxygen peak 51 that next to the N peak 50 on solid line had been reported as a formation of TiNxOy on the top of TiN/TiSi$_2$ bilayer during 920° C., 40 min. in N$_2$ ambient [Ku etal, supra]. The thickness of TiN and/or TiSi$_2$ layers, that can be estimated from energy width in FIG. 2, are 150 nm-TiSi$_2$ for sample F without N$_2^+$ implantation and 30 nm-TiN/110 nm-TiSi$_2$ for sample E with N$_2^+$ implantation, respectively. Silicon peak 52 is seen, as well.

Figure 3:
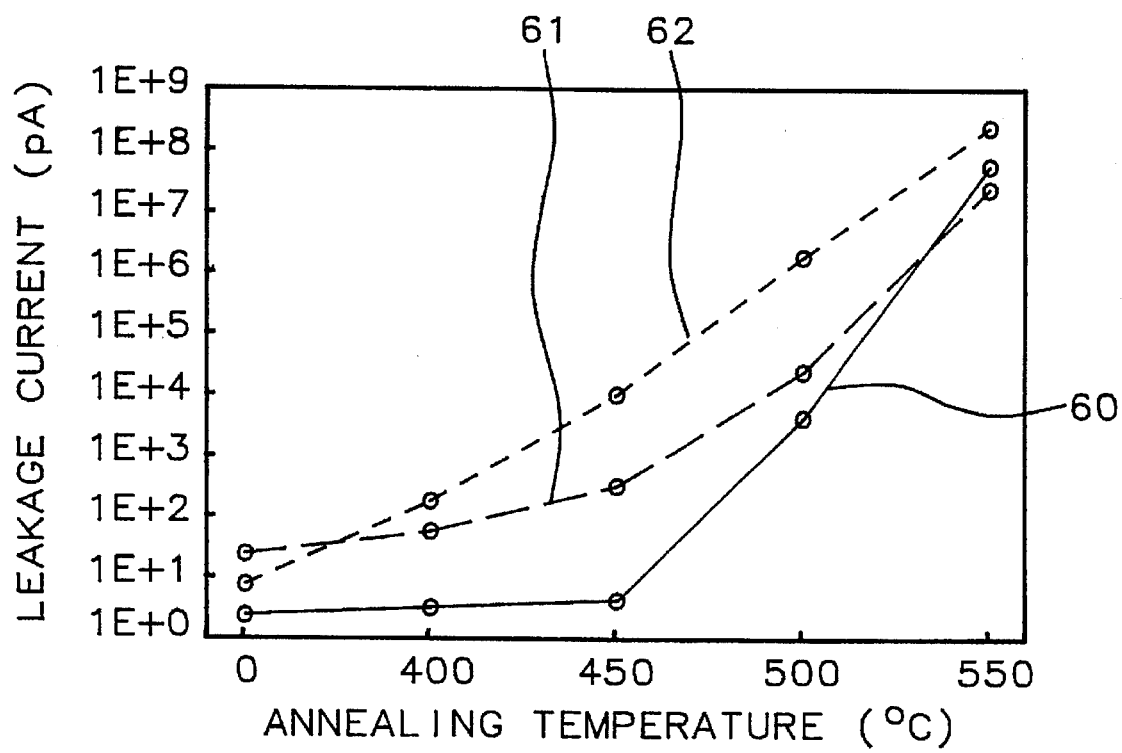
FIG. 3 shows leakage currents of the reverse biased n+/p junction diodes with a junction area of 172, 560 µm$^2$ and a junction depth of 0.32 µm at −5 V as a function of annealing temperature under split post-metallization annealing for 30 minutes.

To measure leakage current and thus to realize the spiking effect the new TiN formation process was employed on a n+/p junction diode with 172560 μm$^2$ area and 0.32 μm junction depth. The leakage of the diode was measured at a reverse bias of −5 V after post-metallization annealing under different temperatures for 30 min, as illustrated in FIG. 3. In particular, FIG. 3 shows leakage currents of the reverse biased n+/p junction diodes with a junction area of 172,560 μm$^2$ and a junction depth of 0.32 μm at −5 V as a function of annealing temperature under split post-metallization annealing for 30 minutes as follows:

(I) Al/TiN/TlSi$_2$/Si with N$_2^+$2+ implanted into C49 TiSi$_x$, (curve 60)

(II) Al/TiN/TiSi$_2$/Si With N$_2^+$ implanted into C54 TiSi$_2$, (curve 61) and (III) Al//TiSi$_2$/Si with N$_2^+$ implantation (curve 62.)

The sample with 30-KeV N$_2^+$ implanted into C49TiSi$_x$ (Line I) before annealing has a very low leakage current of −2.05 pA, then increases slightly up to 450° C. Beyond 500° C. the leakage current becomes very significant which indicates the occurrence of spiking effect of aluminum. This means the formed TiN layer can resist the Al spiking up to 500° C. Also, with this technology the diode possesses the least leakage after annealing in comparison to that with other technology. See line II, curve 61, and line III, curve 62.

Based on the results shown in FIG. 1 and FIG. 3, we conclude that TiN formed by N$_2^+$ implanted into C49-TiSi$_x$, seems to have nearly the same sheet resistance as TiSi$_2$ and to be able to act as an excellent barrier between Al and Si due to its lower leakage. It is submitted that this is due to the increased number of Ti—N bonds formed during the annealing after N$_2^+$ is implanted into C49TiSi as compared to that implanted into C49TiSi$_2$.

Figure 4:
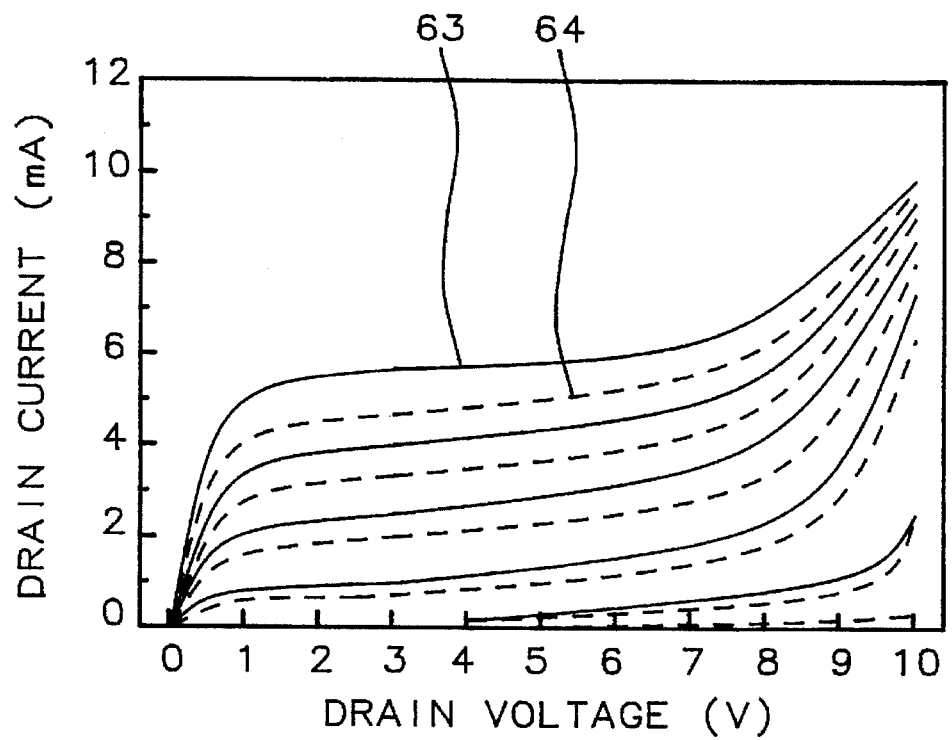
FIG. 4 shows the I/V curves of 0.8 µm CMOSFET fabricated with $N_2^+$ implanted into C49 $TiSi_x$ or C54 $TiSi_2$.

In addition, to show the applicability of the developed process in sub-micron CMOS technology, the process was plied to prepare a 0.8 μm NMOSFET. FIG. 4 shows the I/V curves of 0.8 μm CMOSFET fabricated with N$_2^+$ implanted into C49 TiSi$_x$, see curve 63, or C54 TiSi$_2$, see curve 64. Those I/V curves are highest in these reported structures with a self-aligned TiN/TiSi$_2$ bilayer. Thus the applicability of the process is manifest based on this evidence.

Conclusion

This technology forms a TiN layer by using N$_2^+$ implanted into TiSi, during Ti-salicidation.

The TiN layer formed with this process can avoid TiSi$_2$ morphology from agglomerated after 920° C., 40 min annealing, and retard the spiking of Al into Si-substrate more effectively than others. Thus, this technology possesses a potential application in future deep-submicrometer CMOS technology.

Figure 5:
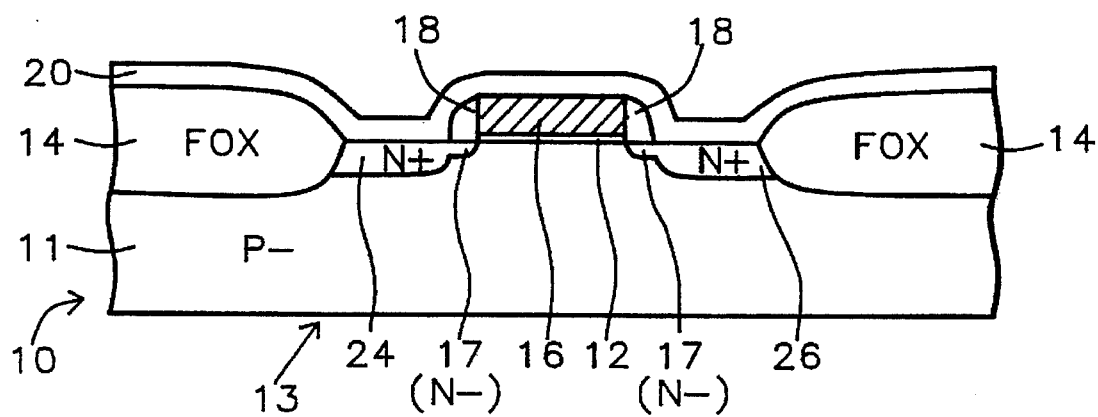
FIG. 5 illustrates the initial stages of manufacture of a device in accordance with this invention.

FIG. 5 illustrates the initial stages of manufacture of a device in accordance with this invention. A CMOS MOSFET device 10 is shown in an early stages of manufacture. The device includes a P-doped silicon substrate 11 upon which a gate oxide layer 12 and field oxide (FOX) regions 14 have been formed. A polysilicon control gate electrode 16 has been formed over both the gate oxide layer 12 between the FOX regions 14.

From the process point of view, the first series steps involved in reaching the stage seen in FIG. 5 includes the formation of the dielectric isolation regions for isolating semiconductor surface regions from other such regions in the semiconductor substrate 11. The semiconductor substrate 11 is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate are masked against oxidation, and then the exposed unmasked surface is oxidized to grow a thermal oxide which in effect sinks into the silicon surface at the unmasked areas. The masked silicon remains as a mesa surrounded by the sunken silicon dioxide or field oxide (FOX) pattern 14.

Then semiconductor devices can be provided in the silicon mesas according to the following processes.

The surface of the silicon substrate 11 is thermally oxidized to form the desired thickness of gate oxide layer 12 having a preferred thickness between about 80 Å to 200 Å. Next, a polysilicon layer (to be formed into control electrode 16) is blanket deposited by LPCVD (Low Pressure Chemical Vapor Deposition) method. The preferred thickness of the polysilicon layer is between about 1000 Å and about 4000 Å. The polysilicon layer can be doped by several methods. One method includes ion implanting with phosphorous or arsenic ions with a dose of between 5 E 15 ions/cm$^2$ and 10 E 15 ions/cm$^2$ at an energy of between 20 KeV and 60 KeV. Alternatively the polysilicon layer is doped with phosphorus oxychloride at a temperature about 900° C.

The device is then covered with a blanket photoresist layer which has been patterned into mask regions. The mask regions protect control gate regions 16 over the gate oxide layer 12.

The portions of the polysilicon layer unprotected by photoresist masks have been removed by anisotropic etching techniques, as is conventional in the art to provide a desired pattern. The etching leaves the gate electrode 16 for a transistor 13.

The source/drain structure of the MOS FET transistor 13 was then formed into an N channel FET integrated circuit device. However, it is well understood by those skilled in the art that a P channel FET integrated circuit device could also be formed by simply substituting opposite doping types in place of those employed in the N channel embodiment. Also, a CMOS FET could in a similar way be formed by making both N channel and P channel devices upon the same substrate.

N- regions 17 have been formed by ion implanting dopant ions to form N- lightly doped drain regions 17 in the portions of substrate 11 beneath the portion of gate oxide layer 12 which are not covered by control electrode 16, which acts as a self-aligned mask. The FOX regions 14 also mask the portions of substrate 11 therebelow. Lithographic masks (not shown) may be required to protect the areas not to be subjected to that particular N- ion implantation. The formation of the lithographic masks is done by conventional lithography and etching techniques. The N- lightly doped drain implantation of regions 17 is done with, for example, phosphorous P$^{31}$ at a dose of between 1 E 13 atoms/cm$^2$ and 10 E 13 atoms/cm$^2$ and with an energy of between about 30 keV and about 80 keV.

Then, a blanket silicon dioxide spacer layer has been formed on the device 10 of FIG. 5. A low temperature silicon oxide deposition is preferred, such as through the chemical vapor deposition of tetraethoxysilane (TEOS) at a temperature in the range of between about 650° C. and about 900° C. Other silicon oxide deposition methods include silane based LPCVD. The thickness of the dielectric silicon dioxide spacer layer is between about 1,000 Å and 4,000 Å, and preferably about 2,500 Å.

Then, dielectric spacers 18 were formed, preferably by a process of anisotropic etching of the spacer layer produces the dielectric spacers 18 on the sidewalls of the control gate 16. The preferred process of anisotropic etching employs a conventional reactive ion etching ambient as will be well understood by those skilled in the art.

Next, a conventional N+ source/drain ion implantation followed preferably using arsenic (As$^{75}$) ions with a dose between about 2 E 15 ions/cm$^2$ and about 1 E 16 ions/cm$^2$ at an energy of between about 20 KeV and about 100 keV to complete the N+ source/drain regions 24/26 of the N channel MOS FET integrated circuit device 13 shown in FIG. 1.

Next, referring again to FIG. 5, to form TiN/TiSi$_2$ bilayer, initially a 80 nm thick titanium film layer 20 composed of titanium is sputtered upon the surface of device 10 covering the gate electrode 16, spacers 18, source/drain regions 24/26 and FOX regions 14.

Figure 6:
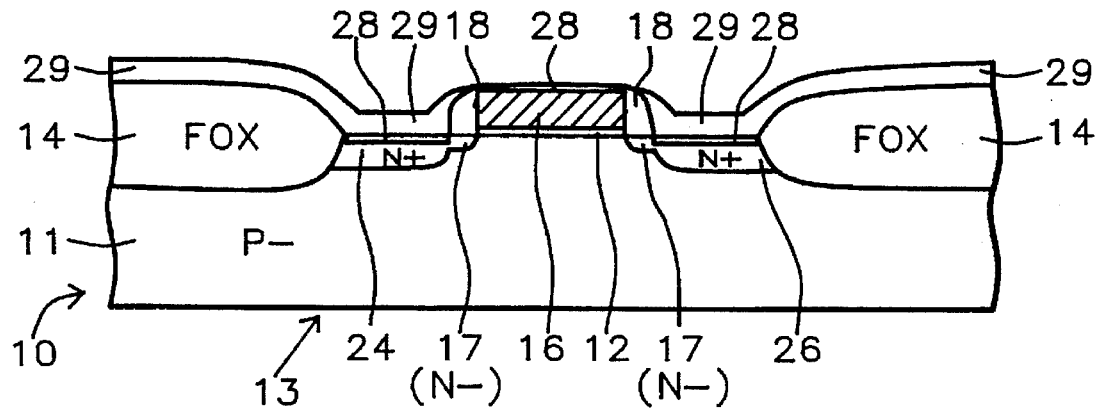
FIG. 6 shows the device of FIG. 5 after a first Rapid Thermal Anneal (RTA) was performed in a nitrogen gas ($N_2$) ambient atmosphere forming a titanium silicide ($TiSi_x$).

FIG. 6 shows the device 10 of FIG. 5 after a first Rapid Thermal Anneal (RTA) was performed at 680° C. for 40 seconds in a nitrogen gas (N$_2$) ambient atmosphere forming a titanium silicide (TiSi$_x$) thin film 28 over the polysilicon gate electrode 16 and over the N+ doped S/D regions 24/26. In addition, over the entire surface of said FOX regions 14 a thicker film 29 of titanium nitride TiN is formed by reaction between the titanium and the nitrogen gas atmosphere.

Figure 7:
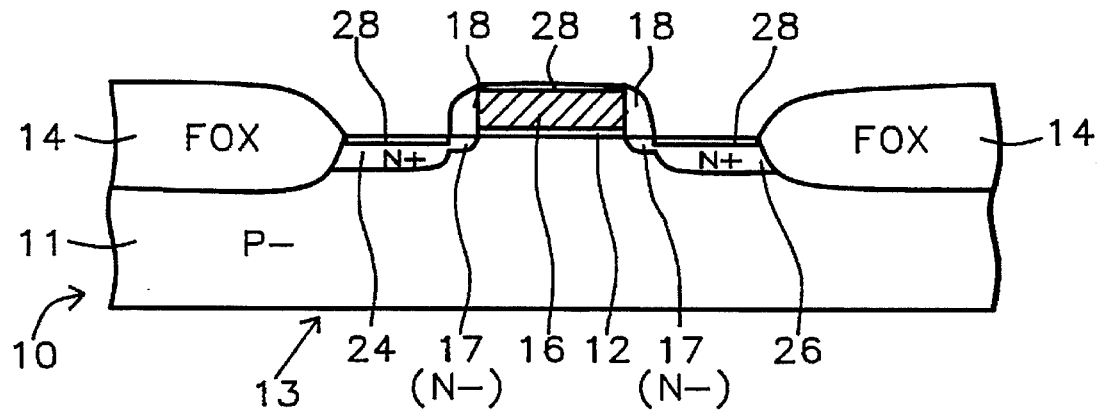
FIG. 7 shows the device of FIG. 6 after the $TiN_xO_y$ and/or unreacted Ti on the top were selectively etched away from the device leaving the titanium silicide (TiSi$_x$) thin film over the polysilicon gate electrode and over the N+ doped S/D regions.

FIG. 7 shows the device 10 of FIG. 6 after the TiN$_x$O$_y$ and/or unreacted Ti on the top were selectively etched away from the device 10 leaving the titanium silicide (TiSi$_x$) thin film 28 over the polysilicon gate electrode 16 and over the N+ doped S/D regions 24/26.

Figure 8:
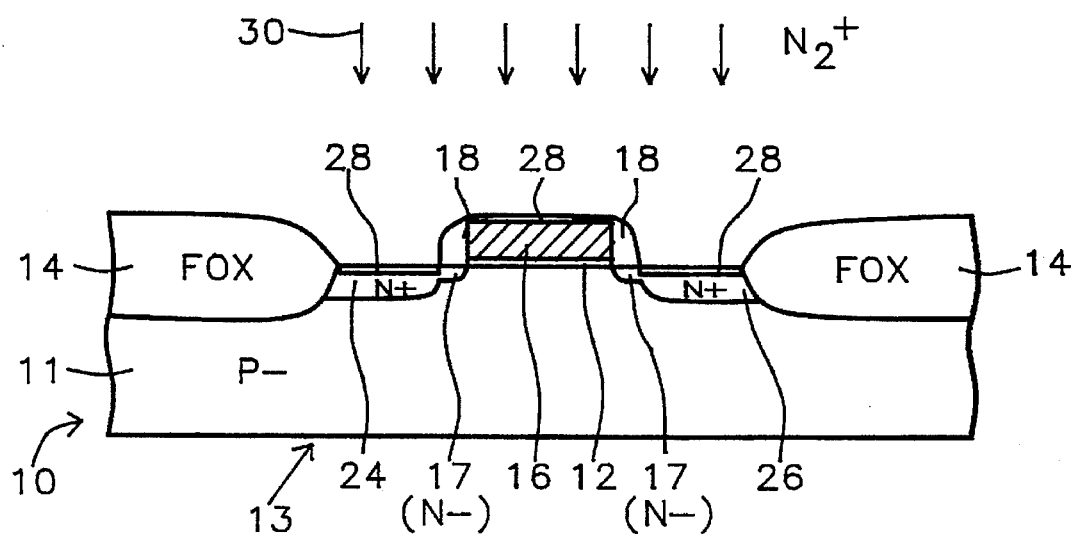
FIG. 8 shows the device of FIG. 7 after the device has been ion implanted with $^{28}N_2^+$ molecular ions.

FIG. 8 shows the device 10 of FIG. 7 after the device has been ion implanted with $^{28}$N$_2^+$ molecular ions with 1×10$^{16}$ ions/cm$^2$ dose under different 20–50 KeV energies were implanted into so-called C49TiSi$_x$ [Okamoto et al supra], respectively.

Figure 9:
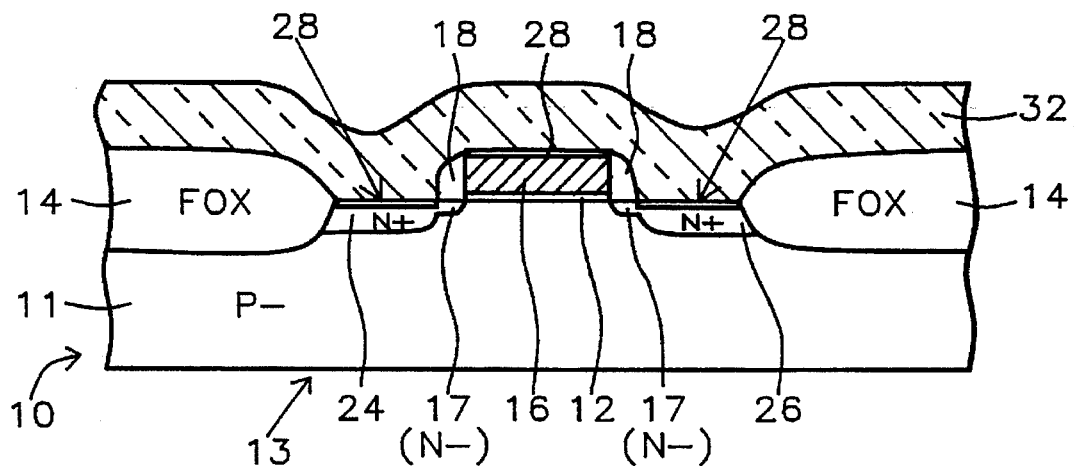
FIG. 9 shows the device of FIG. 8 after a BPSG (borophosphosilicate glass) dielectric cap was deposited end flowed providing a second Rapid Thermal Anneal (RTA).

FIG. 9 shows the device 10 of FIG. 8 after a BPSG dielectric cap 32 was deposited and flowed at 920° C. for forty (40) minutes. This flow process is also regarded as the second annealing of Ti-salicidation. Diodes formed with 80 KeV, 5.5×10$^{15}$ ions/cm$^2$, the arsenic (As) dosed junction and 0.8-μm CMOSFET's with Al/TiN/TiSi$_2$ contacts were prepared using this technology.

For comparison purpose, diodes with N$^+$ implanted into so-called C54TiSi$_2$ was also fabricated [Nishiyama et al supra]. The $N_2^+$ was implanted after the second annealing to convert C49TiSi$_x$ to C54TiSi$_2$ had been done at 850° C. for 20 seconds in a nitrogen gas (N$_2$) ambient, then followed by BPSG deposition and thermal flow to smooth the surface of the BPSG layer.

While this invention has been described In terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all Such changes come within the purview of the present invention and the invention encompasses the subject matter of the claims which follow.

Having thus described the invention, what is claimed as new and desirable to be secured by Letters Patent is as follows:

1. A method for fabricating a semiconductor device having a silicon containing material to which a metal contact is to be made, said device including oxide containing regions, said step including the sequence of steps comprising, initially forming a blanket layer of titanium on said device having a thickness of about 80 nm, then performing a first annealing step on said device comprising rapid thermal annealing of said device in a nitrogen gas atmosphere at about 680° C. for about forty seconds to convert said titanium layer into reaction products comprising titanium silicide over said silicon containing material and titanium nitride over said oxide containing regions, next etching said device to remove unreacted portions of said titanium and to remove said titanium nitride from said device, next performing a step of ion implanting nitrogen molecular ions into said titanium silicide, on said device, next forming a dielectric cap over said device, and then heating said device at about 920° C. for about forty minutes to flow said dielectric cap and performing a second annealing step, thereby annealing said titanium silicide reaction products of titanium after said ion implanting of said nitrogen molecular ions.

2. A method in accordance with claim 1 wherein said rapid thermal annealing which is performed at about 680° C. for about forty seconds produces combinations and compounds of titanium, nitrogen and oxygen, generally defined by TiN$_x$O$_y$ where x and y are integers, over portions of said device and titanium silicide over silicon containing portions of said device.

3. A method for fabricating a semiconductor device having a silicon containing material to which a metal contact is to be made by the sequence of steps comprising, initially forming a blanket layer of titanium on said device, next performing a first annealing step comprising rapid thermal annealing of said device in a nitrogen gas atmosphere at about 680° C. for about forty seconds to convert said titanium layer on said silicon containing material into titanium silicide and forming titanium nitride elsewhere on said device, next etching said device to remove unreacted portions of said titanium and said titanium nitride from said device, then ion implanting nitrogen molecular ions into said device, next forming a borophosphosilicate glass layer over said device, and then heating said device with a second annealing step at a temperature of about 920° C. for about forty minutes to flow said borophosphosilicate glass layer and anneal said titanium silicide after said ion implanting of said nitrogen molecular ions.

4. A method in accordance with claim 3 wherein said rapid thermal annealing step is performed at about 680° C. for about forty seconds producing combinations and compounds of titanium, nitrogen and oxygen, generally defined by TiN$_x$O$_y$ where x and y are integers, over portions of said device and titanium silicide over silicon containing portions of said device.

5. A method for fabricating a semiconductor device having a silicon containing material to which a metal contact is to be made comprising, starting with a doped silicon substrate with field oxide regions formed thereon, a doped polysilicon gate electrode with sidewalls formed over an oxide layer on the surface of said substrate, and dielectric spacers formed adjacent to said sidewalls of said gate electrode, with source/drain regions formed in said substrate adjacent to said polysilicon gate electrode and said spacers, next forming a blanket layer of titanium on said device having a thickness of about 80 nm, next performing a first rapid thermal annealing process on said device at about 680° C. for about forty seconds in a nitrogen gas atmosphere to produce combinations and compounds of said titanium layer with nitrogen and oxygen resulting titanium, titanium nitride and combinations and compounds of titanium, nitrogen and oxygen, generally defined by TiN$_x$O$_y$ where x and y are integers, over portions of said device and to produce titanium silicide over silicon containing portions of said device including the surface of said polysilicon gate electrode and the surfaces of said source/drain regions, next etching said device to remove said titanium, said titanium nitride and said TiN$_x$O$_y$ from said device leaving said titanium silicide, C49TiSi$_x$, over said gate electrode and over said source/drain regions on said device, next ion implanting nitrogen 28N$_2^+$ molecular ions into said C49TiSi$_x$ on said device with a dose of about $1\times10^{16}$ ions/cm$^2$ at an energy from about 20 KeV to about 50 keV, next forming a dielectric cap over said device, and then heating of said device at about 920° C. for about forty minutes to flow said dielectric cap and provide a second annealing step for said titanium silicide, after said ion implanting of nitrogen molecular ions.

* * * * *